(12) United States Patent
Yano

(10) Patent No.: US 6,687,158 B2
(45) Date of Patent: Feb. 3, 2004

(54) GAPLESS PROGRAMMING FOR A NAND TYPE FLASH MEMORY

(75) Inventor: Masaru Yano, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 85 days.

(21) Appl. No.: 10/029,666

(22) Filed: Dec. 21, 2001

(65) Prior Publication Data

US 2003/0117850 A1 Jun. 26, 2003

(51) Int. Cl.$^7$ .............................................. G11C 16/04
(52) U.S. Cl. ............................ 365/185.17; 365/185.05; 365/185.33
(58) Field of Search ..................... 365/185.17, 185.05, 365/185.33, 189.05, 230.08, 205

(56) References Cited

U.S. PATENT DOCUMENTS

| 5,625,590 A | * 4/1997 | Choi et al. ............. 365/185.17 |
| 5,852,576 A | 12/1998 | Le et al. |
| 5,926,520 A | 7/1999 | Yano |
| 5,978,267 A | 11/1999 | Chen et al. |

OTHER PUBLICATIONS

Xilinx "Xilinx Generic Flash Memory Interface Solutions", May 8, 2001, pp. 1–12.
Elm–Chan.org SmartMedia (NAND–type Flash Memory), Aug. 30, 2001, pp. 1–3.

* cited by examiner

Primary Examiner—David Lam
(74) Attorney, Agent, or Firm—Sheppard Mullin Richter & Hampton LLP

(57) ABSTRACT

Techniques, including a system and method, for reducing the total time for writing a plurality of pages to a NAND-type flash memory array are provided. In one embodiment, the writing is divided into two parts. The first part receives and holds the next page in an intermediate buffer, while the present page, stored in the page buffer, is used to program the memory array. Then the next page is loaded into the page buffer. In parallel with the next page being programmed into the memory array, another page is input and held in the intermediate buffer. Thus, substantially gapless writing of the plurality of pages to the NAND-type flash memory array is achieved with the associated reduction in total time.

30 Claims, 12 Drawing Sheets

FIG. 6

| Time Interval | ta1 | ta2 | ta3 | ta4 | ta5 | ta6 |
|---|---|---|---|---|---|---|
| Page 1 | Data Input | Program Page | | | | |
| Page 2 | | | Data Input | Program Page | | |
| Page 3 | | | | | Data Input | Program Page |

FIG. 7

| Time Interval | ta1 | ta2 | ta3 | ta4 | ta5 | ta6 |
|---|---|---|---|---|---|---|
| Page 1 | Data Input | Program Page | | | | |
| Page 2 | | Data Input | Program Page | | | |
| Page 3 | | | Data Input | Program Page | | |

GAPLESS PROGRAMMING FOR A NAND TYPE FLASH MEMORY

FIELD OF THE INVENTION

The invention relates generally to the field of electronic memory design, and in particular to techniques for improving performance in a NAND type flash memory.

BACKGROUND OF THE INVENTION

Demand for flash memory is growing rapidly due to the wide range of portable and embedded products with increased storage requirements. A flash memory can replace a bulk storage medium such as a hard disk, and is used in, for example, digital cameras, and voice mail systems. A NAND Flash memory cell array typically includes several single bit storage transistors, i.e., memory cells, in series. These memory cells are organized into pages. For example, a page may include 512 bytes (4096 bits). There are several pages per block, where erasing is done on a per block basis. Read access to the memory cell array is by page. Given a starting page address, sequential pages may be read out quickly, for example, with a 50 nsec cycle time per byte. Access to a byte within a page is done sequentially. Writing a page to the memory cell array is done in two steps: first, the address and data are written to an internal register, i.e., page buffers; and second, a special command initiates the writing, i.e., programming, of the data in the internal register to the non-volatile memory cell array. The writing of the data is done only on a per page basis. While the read access is fast, write time is slow, for example 200 $\mu$sec.

FIG. 1 is a simplified architecture of a typical prior art NAND type flash memory device. The NAND Flash memory architecture 110 includes a State Machine 112, a Command Register 114, and an Address Register 116, a Status Register 118, a Memory Array 120, a Y Decoder 122, Page Buffers 124, a X-Decoder 126, and I/O Registers 132. The I/O Registers 132 receive input/output to the memory device through the I/O Ports 134. The I/O Ports 134 receive a page address, which is sent to the Address Register 116. The I/O Registers 132 next receive data for that address. This data is sent to the Y-Decoder 122 and written in Page Buffers 124, for example, page 130, using the address from the Address Register 116 via the X-Decoder 126. Each rising edge of a write enable bar (WEbar) signal 136 writes one byte of data from the I/O Registers 134 to eight one-bit page buffers in Page Buffers 124. A programming control signal from the Ready/Busy Line (not shown) then writes the data in the Page Buffers 124 to the memory cells in Memory Array 120, e.g., page 130. To read a page, e.g. page 130, the page address in Page Address Register 116 is sent to the X-Decoder 126 to access the page, and write it to the Page Buffers 124 for reading. The Read Enable bar (REbar) signal 138 is used to read out the data to the I/O Registers 132.

FIG. 2 is a simplified and expanded block diagram of a typical Memory Array 120 of the prior art. FIG. 2 shows a plurality of blocks of data, for example blocks 212, 214, 218, 222 and 220. In block 212 there are one or more pages, for example, page_0 240 and page_i 242. Page_i 242 includes 512 memory cells, e.g., 244, 246, and 248, where each memory cell stores one bit. Each memory cell within a page is programmed by 512 parallel bit lines (BL), e.g., BL0 230 for cell 244, BL1 232 for cell 246, and BL511 234 for cell 248. All 512 memory cells in a page, e.g., Page_i 240, are programmed concurrently. Each block, e.g., block 212 has an associated seven other blocks, e.g., 214, 218, and five other blocks (not shown). This group of blocks is programmed (and read) in parallel, so that bytes of data, rather than bits of data, may be accessed per page, e.g., 512 bytes for Page_i 242. Thus, each block e.g., block 212, has a plurality of pages, e.g., Page_i 242, where each page, e.g., Page_i 242, has 512 bits concurrently programmed by bit lines BL0 230 to BL511 234. And each block is eight bits deep, e.g., blocks 212 to 218, so that Page_i has 512 bytes programmed (and read) in parallel.

FIG. 3 is an example of an expanded view 310 of the Page Buffers 124 for 512 bits. For example, for page Page_i 242 there are 4096 (512×8) page buffers for a 512-byte page. Page Buffer 312 is an example page buffer for one bit. The Page Buffer 312 is one Page Buffer of the plurality of Page Buffers 124 in FIG. 1. The Page Buffer 312 includes a data line, DATA1 314 that receives one bit of data from I/O Registers 132 via the Y-Decoder 122 of FIG. 1 upon the rising edge of WEbar 136. DATA1 314 is stored using a "keeper," having back-to-back inverters, i.e., inverter 334 and inverter 336. When the signal POMON 322 is high, transistor 332 turns on, and when BL CONTROL 326 is high, the value stored in the keeper is then sent to bit line BL1 232 and used to program, for example, memory cell 246 in Page_i 242 of FIG. 2.

Also shown in FIG. 3 are PMOS transistor 330, NMOS transistors 338 and 340, SET signal 324 and PBIAS signal 320. These components are related to a method for verifying the complete erasure of the memory cells (e.g., 244, 246, 248) during a block erase operation, as taught, for example, by U.S. Pat. No. 6,009,014, and do not form part of the present invention. After a block erase operation, the keeper formed by inverters 334 and 336 is placed in a set state (output of inverter 334 high) by grounding DATA1 signal 314 while PGMON signal 322 is low. BLCONTROL signal 326 is then set high, thereby coupling pagebuffer 310 to bit line BL1 (232) via a pass transistor 342, and thereby to a set of memory cells to be tested. PBIAS signal 320 is then activated to cause transistor 330 to generate a test current, which is directed to the memory cells by way of the conducting pass transistor 342. If the memory cells have been fully erased, the test current will be fully conducted by the cells. However, if the memory cells are not fully erased, the test current will accumulate at the gate of NMOS transistor 338, causing it to turn on and be conductive. As the next step in the erase verification step, SET signal 324 is momentarily pulsed to a high state, causing NMOS transistor 340 to conduct. If NMOS transistor 338 is also conducting at this time (because the memory cells are not fully erased), the input of inverter 336 will be grounded and the keeper is placed in a reset state (output of inverter 334 low). After the pulsing of SET signal 324, the keeper may be read via DATA1 line 314 to determine if it has been reset, indicating incomplete erasure.

FIG. 4 is a simplified timing diagram 410 showing the writing process of a typical NAND type flash memory of the prior art. An example NAND Flash memory device is the Advanced Micro Devices (AMD) C-MOS 3.0 volt-only NAND Flash Memory Am3LV0I28D. The write enable bar (WEbar) 412 shows a plurality of write pulses, e.g., rising edges 414, 416, and 418. The data 420, for example DATA0 422, DATA1 424, and DATA511 426, is read from the I/O Registers 132 and written into the Page Buffers 124 at each rising edge of WEbar 412 e.g., 414, 416, 418. For example, DATA0 422 (one byte) is written into its eight page buffers on the rising edge of 414 of WEbar 412. This is done for the 512 bytes. Next the Ready/Busy Line (R1B) 430 transitions from high to low 432 to start the programming of the data in the Page Buffers 124 into a page, e.g. page 130, in Memory Array 120 (FIG. 1). The programming time 434 is a pulse typically lasting approximately 200–250 microseconds. From FIG. 4, for each data write of a page into the memory array, there is a series of write enable pulses to input data into the page buffers, followed by a programming pulse to program the page into the memory array. The problem is that this sequential process of input data—program page, input next data—program next page, etc., for writing a plurality of sequential pages is time consuming.

Therefore with the problems of a slow writing time for NAND type flash memories, there is a need to decrease the time for sequential writes to the memory array, i.e., improve the performance of writing data to the memory array.

SUMMARY OF THE INVENTION

The present invention provides techniques, including a system and method, for reducing the total time for writing a plurality of pages to a NAND type flash memory array. In one exemplary embodiment of the present invention, the writing is divided into two parts. The first part receives and holds the next page in an intermediate buffer, while the present page, stored in the page buffer, is used to program the memory array. Then the next page is loaded into the page buffer. In parallel with the next page being programmed into the memory array, another page is input and held in the intermediate buffer. Thus, in this embodiment, pipelining of the writing of the plurality of pages to the NAND type flash memory array is achieved with the associated reduction in total time.

In an embodiment of the present invention a method for writing a plurality of pages to a flash memory using pipelining is provided. First, a first data input is received including a first page; and then the first page is programmed in parallel with receiving a second data input, where the second data input includes a second page.

Another embodiment of the present invention provides a method for substantially gapless programming of a NAND type flash memory. First, a first data input is received that includes a first page. Next, the first page is programmed into a plurality of memory cells of the NAND type flash memory. And after the receiving the first data input, a second data input is received in parallel with the programming of the first page, where the second data input includes a second page.

Yet another embodiment of the present invention provides a system for improving performance in a NAND type flash memory array. The system includes: a first buffer circuit for receiving a first data item; a memory cell in the NAND type flash memory array that is programmed using the first data item; a second buffer circuit for receiving a second data item while the memory cell is programmed using the first data item; and a switch for transferring the second data item to the first buffer circuit.

A fourth embodiment of the present invention provides a system for improving performance in a NAND type flash memory array. The system includes: a data latch for receiving a first page data item from a I/O register; a dataload switch for transferring the first page data item to a pagebuffer; and a memory array cell for non-volatile storing of the first page data item, where the data latch receives a second page data item in parallel with the storing of the first page data item.

A fifth embodiment of the present invention provides a method for reducing a total time for writing a plurality of sequential pages of data. First, a data latch is loaded with a next page of the plurality of sequential pages of data; and concurrently with the loading, operations are performed on a memory array. The operations on the memory array include: programming the memory array with a page of the plurality of sequential pages of data, where the page is stored in a Pagebuffer; verifying the programming; and when the next page is loaded properly into the data latch, loading the Pagebuffer with the next page.

A sixth embodiment of the present invention provides a method for transferring a plurality of pages to and from a flash memory. First, a first data input, including a first page, is received. Next, the first page is programmed into the flash memory in parallel with receiving a second data input, where the second data input includes a second page. Lastly, a third page is read from the flash memory in parallel with the programming of the first page.

A seventh embodiment of the present invention provides a system for improving performance in a NAND type flash memory array. The system includes: a first buffer circuit for receiving a first data item; a first memory cell in the NAND type flash memory array that is programmed using the first data item; a second buffer circuit for receiving a second data item while the first memory cell is programmed using the first data item; a switch for transferring the second data item to the first buffer circuit; and a third buffer circuit for receiving the reading of a second memory cell in the NAND type flash memory array, while the first memory cell is programmed using the first data item.

These and other embodiments, features, aspects and advantages of the invention will become better understood with regard to the following description, appended claims and accompanying drawings.

BRIEF DESCRIPTION OF THE DRAWINGS

FIG. 6 is a table showing a conventional write sequence for three consecutive pages of a conventional NAND type Flash memory;

FIG. 7 is a table illustrating an example of pipelining of an embodiment of the present invention;

DETAILED DESCRIPTION OF THE INVENTION

In the following description, numerous specific details are set fourth to provide a more thorough description of the specific embodiments of the invention. It is apparent, however, to one skilled in the art, that the invention may be practiced without all the specific details given below. In other instances, well known features have not been described in detail so as not to obscure the invention.

Figure 4:
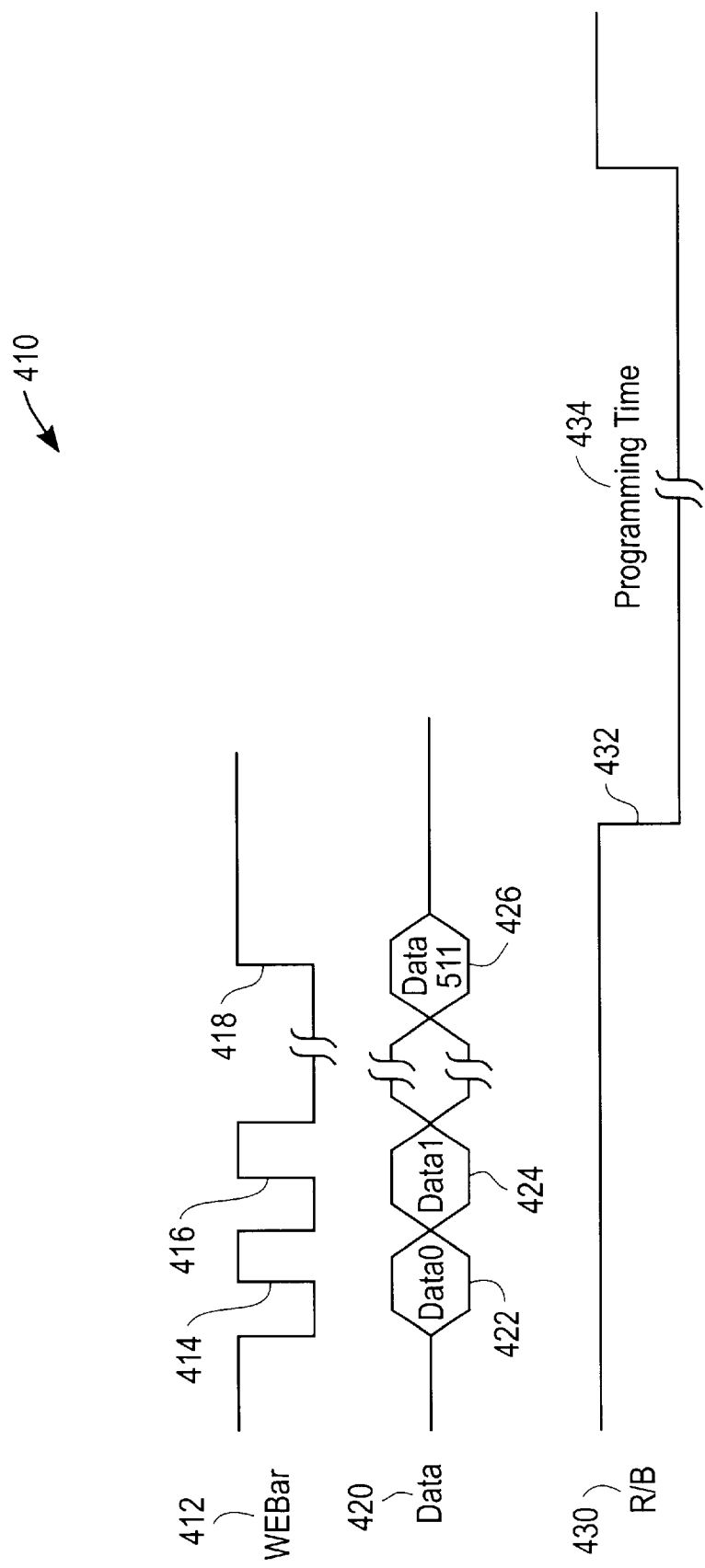
FIG. 4 is a simplified timing diagram showing the writing process of a typical NAND type flash memory of the prior art.
Figure 5:
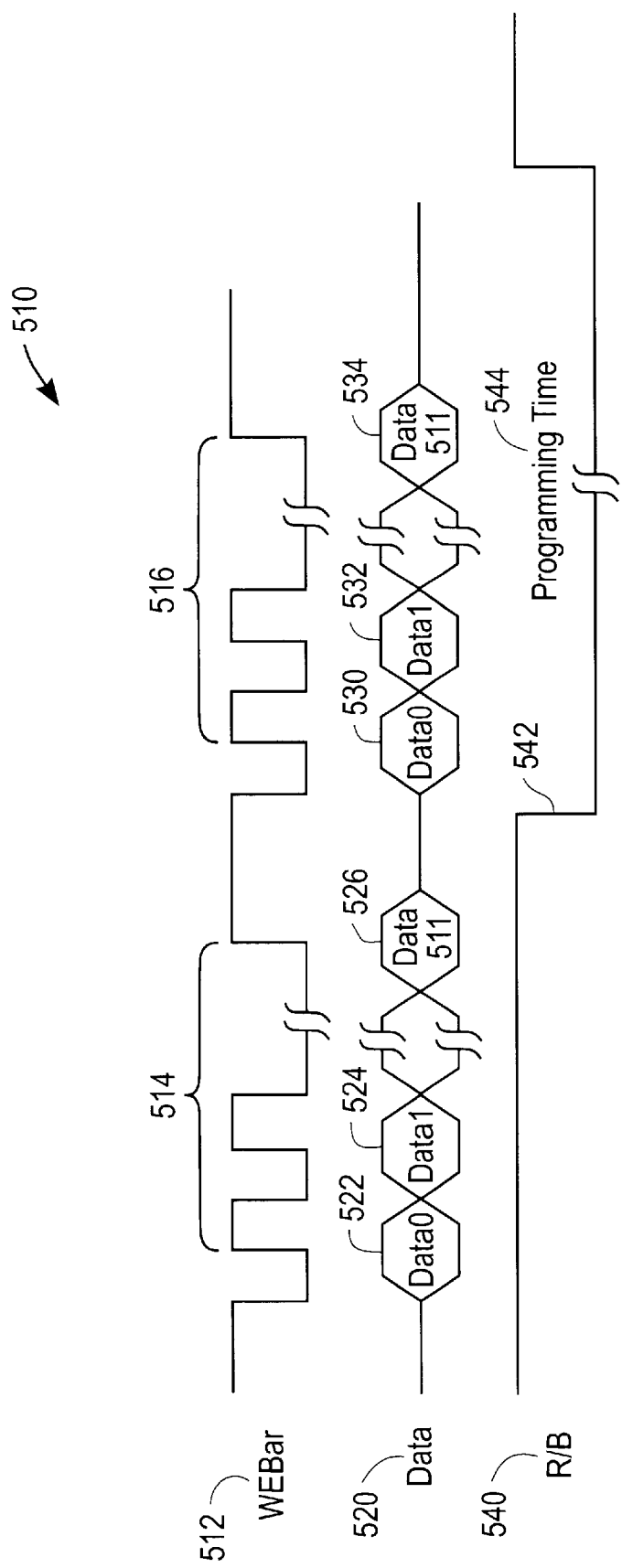
FIG. 5 is a simplified timing diagram illustrating a substantially gapless embodiment of the present invention.

FIG. 5 is a simplified timing diagram 510 illustrating a substantially gapless embodiment of the present invention. The WEbar signal 512 has two groups of pulses, a first group 514 inputting, a page from the I/O Registers 132 into Pagebuffers 124, and a second group 516 inputting the next page from the I/O Registers 132 into Pagebuffers 124. The data is shown by Data signal 520 that has a corresponding first group of 512 bytes, e.g. 522, 524, 526 for the first page, and a second group of 512 bytes, e.g., 530, 532, and 534, for the next page. When the Ready/Busy (RIB) 540 transitions from high to low 542, pulse 544 occurs, indicating that data in the Pagebuffers 124 is being programmed into the Memory Array 120, the second group 516 of WEbar 512 pulses inputs the second group of data, e.g., 530, 532, and 534, for the next page into the Pagebuffers 124. This allows substantially gap less programming of Memory Array 120, because at the next programming time after programming time 544, the data in the Page Buffers is ready to be programmed. This is an advantage over the prior art, where the Memory Array needed to wait until the group of data for the next page was input into the Page Buffers 124 before programming could start (e.g., FIG. 4).

FIGS. 6 and 7 illustrate the differences between a conventional NAND type Flash memory and a NAND Flash memory of an embodiment of the present invention. FIG. 6 is a table showing a conventional write sequence for three consecutive pages of a conventional NAND Flash memory. Table 610 shows the time intervals 612, for example, ta1 614, ta2 616, ta3 618, ta4 620, ta5 622, and ta6 624. There are three rows showing the three consecutive pages, e.g., page 1 630, page 2 632 and page 3 634. Page 1 630 has data input 640 at time interval ta1 614, followed by the programming of page 1 642 at time interval ta2 616. Page 2 632 must wait until page 1 630 is finished programming its page 642, before it may input data 644 at time interval ta3 618. Page 2 632 then programs its page 646 at time interval ta4 620. Similarly page 3 634 must wait until time interval ta5 622 before it may input data 650. Thus, the sequence for programming each page into the memory array includes a data input followed by programming the page, where the next page may not start inputting data into the page buffer until the previous page has finished programming the page into the memory array.

The Status Register 118 may be used to monitor the progress of the programming cycle and should be checked after the end of the programming cycle to verify that programming was successful. Hence the Status Register 118 may be checked during and after programming of a page. In FIG. 6 reading the Status Register 118 to verify the programming of a page can occur for example, for page 1 630 at ta3 618, for page 2 632 at ta5 622, and so forth. For FIG. 7, verifying the programming of a page, i.e., reading the Status Register, can occur at, for example, ta3 for page 1 630, ta4 620 for page 2, and ta5 622 for page 3 634.

FIG. 7 is a table 710 illustrating an example of pipelining of an embodiment of the present invention. In FIG. 7 the time intervals 612 are the same as in FIG. 6 for comparison purposes. Page 1 630 has data input 640 at time interval ta1 614, followed by page 1 programming 642 at time interval ta2 616. Page 2 632 is now pipelined such that the data input 644 may start at time interval ta2 616 rather than at time interval ta3 618 as in FIG. 6. Page 2 programming 646 at time interval ta3 618 follows the data input 644. Page 3, likewise, is pipelined such that data input 650 may start at time interval ta3 rather than at time interval ta5 622 as in FIG. 6. Page 3 programming 652 at time interval ta4 620 follows data input 650. Thus the pipelining embodiment of FIG. 7 has reduced the programming time by several time intervals, e.g., ta5 622 and ta6 624, and hence improved the performance of writing to the NAND type Flash memory.

Figure 2:
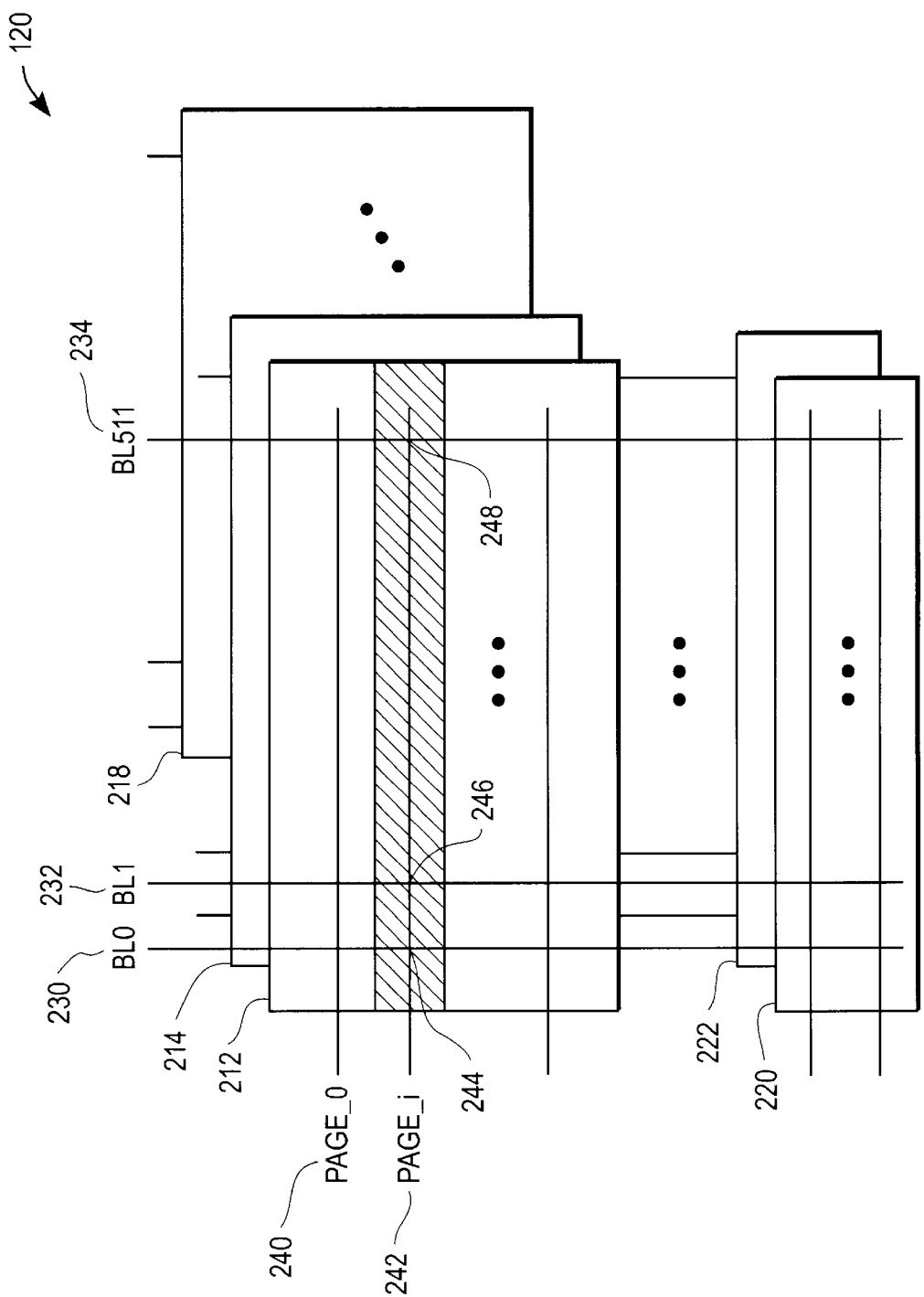
FIG. 2 is a simplified and expanded block diagram of a typical memory array of the prior art.
Figure 3:
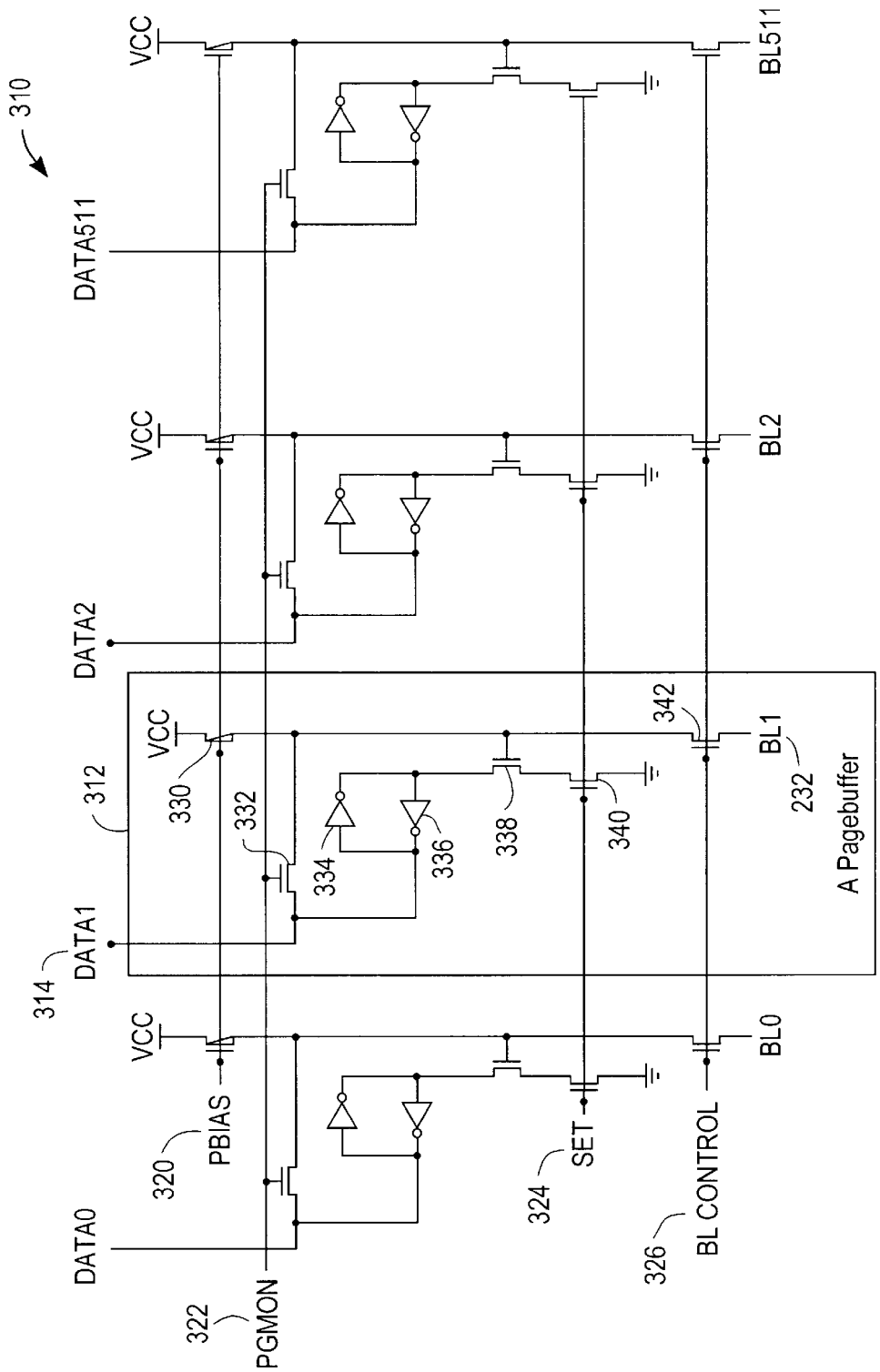
FIG. 3 is an example of an expanded view of typical Pagebuffers of the prior art for 512 bits.
Figure 8:
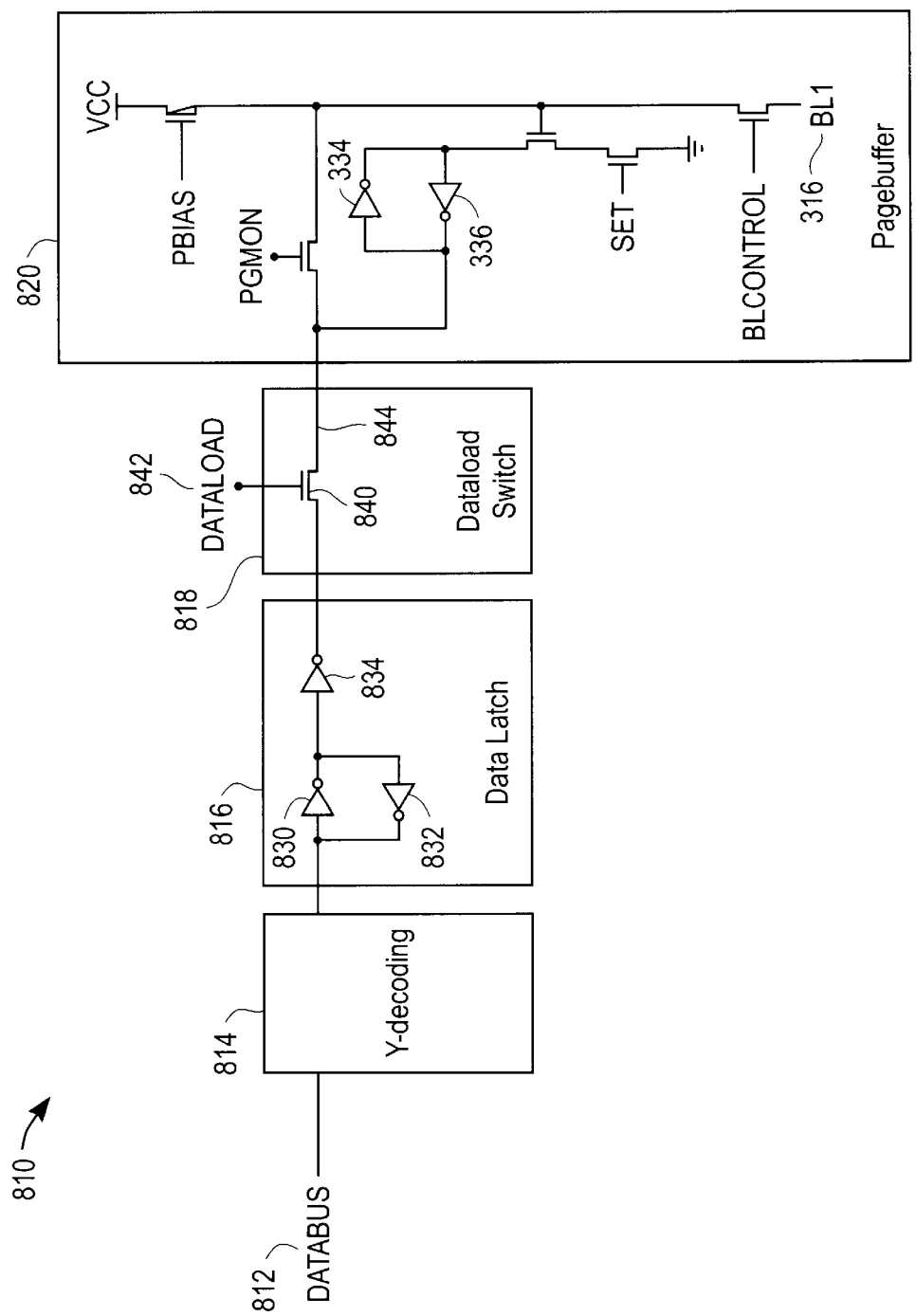
FIG. 8 is a system diagram of an embodiment of the present invention for one bit.

FIG. 8 is a system diagram 810 of an embodiment of the present invention for one bit. FIG. 8 has a Data Bus 812, which is input to a Y-decoding circuit 814. One bit is shown outputting Y-decoding circuit 814 and being input into Data Latch 816. The output of the Data Latch 816 is coupled to a Data Load Switch 818, which outputs the one bit through signal line 844 to Pagebuffer 820. In FIG. 8, the example of Pagebuffer 820 is substantially similar to the Pagebuffer 312 in FIG. 3. Pagebuffer 820 outputs a bit line, e.g., BL1 316 into the Memory Array 120 to program a memory cell, e.g., memory cell 246 (FIG. 2). The Data Latch 816 includes a keeper, which has back-to-back inverters, 830 and 832. The output of the keeper then goes to inverter 834 to correct the inversion of the keeper. The Data Latch 816 functions to store the data of the next page, while the present page data, stored in the page buffer, is being programmed into the memory array. The Data Load Switch 818 includes a nMOS transistor 840 which acts as an on and off switch to connect or disconnect the Data Latch 816 to Pagebuffer 820 depending on the high or low value of the DATAload signal 842, respectively. In other embodiments the Data Latch 816 includes a register, memory cell, or any other storage device, volatile or non-volatile. In another embodiment the Data Load Switch 818 includes a pMOS transistor, a combination of one or more CMOS transistors, a logic gate, a tn-state circuit, a network switch, or any other on-off switching circuit. In alternative embodiments, the Pagebuffer 820 includes a register, memory cell, or any other storage device, volatile or non-volatile. While FIG. 8 shows the implementation for one bit, one of ordinary skill in the art can extend it to the rest of the memory array, for example, FIG. 2 and FIG. 3.

Figure 9:
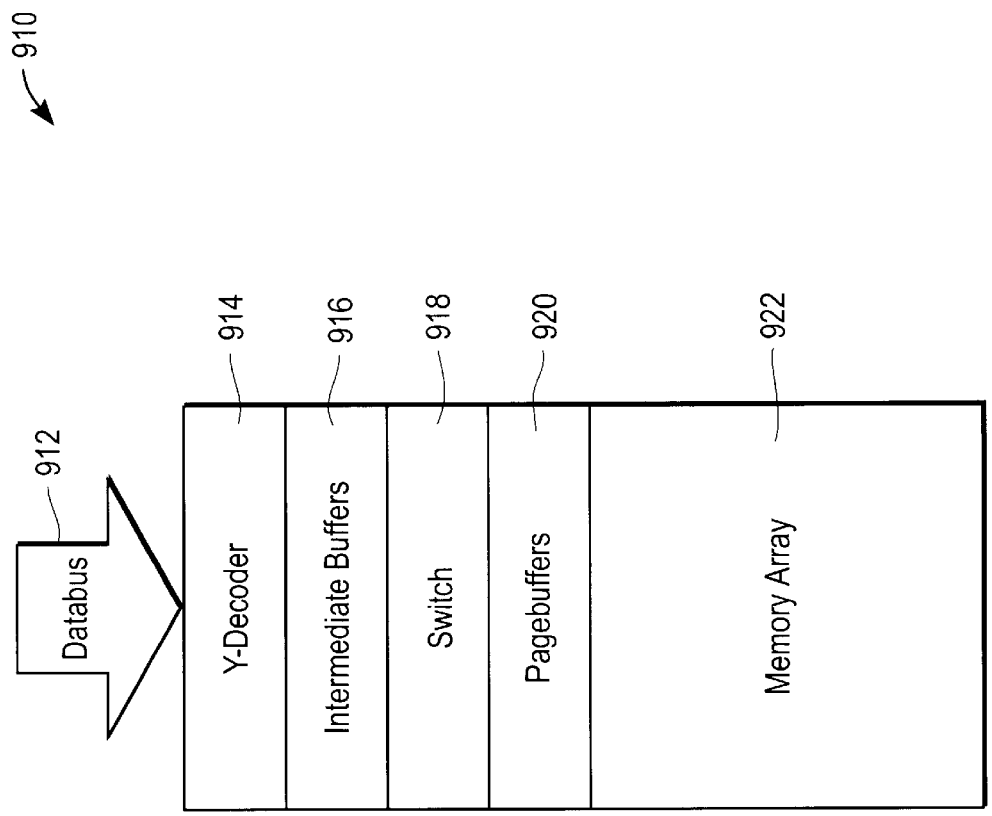
FIG. 9 illustrates a simplified block diagram of a pipelining system of another embodiment of the present invention.

FIG. 9 illustrates a simplified block diagram 910 of a pipelining system of another embodiment of the present invention. The I/O Registers 132 sends data through Data Bus 912 to Y-Decoder 914 to be stored in an intermediary storage, Intermediate Buffers 916. When a Switch 918 is turned on, the data in Intermediate Buffers 916 is passed to Page buffers 920. The data in Pagebuffers 920 is then programmed into the NAND type Flash Memory Array 922 on a page-by-page basis. The Switch 918 acts as a wall that allows the Page buffers 920 and the Intermediate Buffers 916 to operate concurrently. Thus page data of the next page maybe stored in Intermediate Buffers 916 concurrently or in parallel with data of the present page in Pagebuffers 920 being programmed into Memory Array 922.

Figure 1:
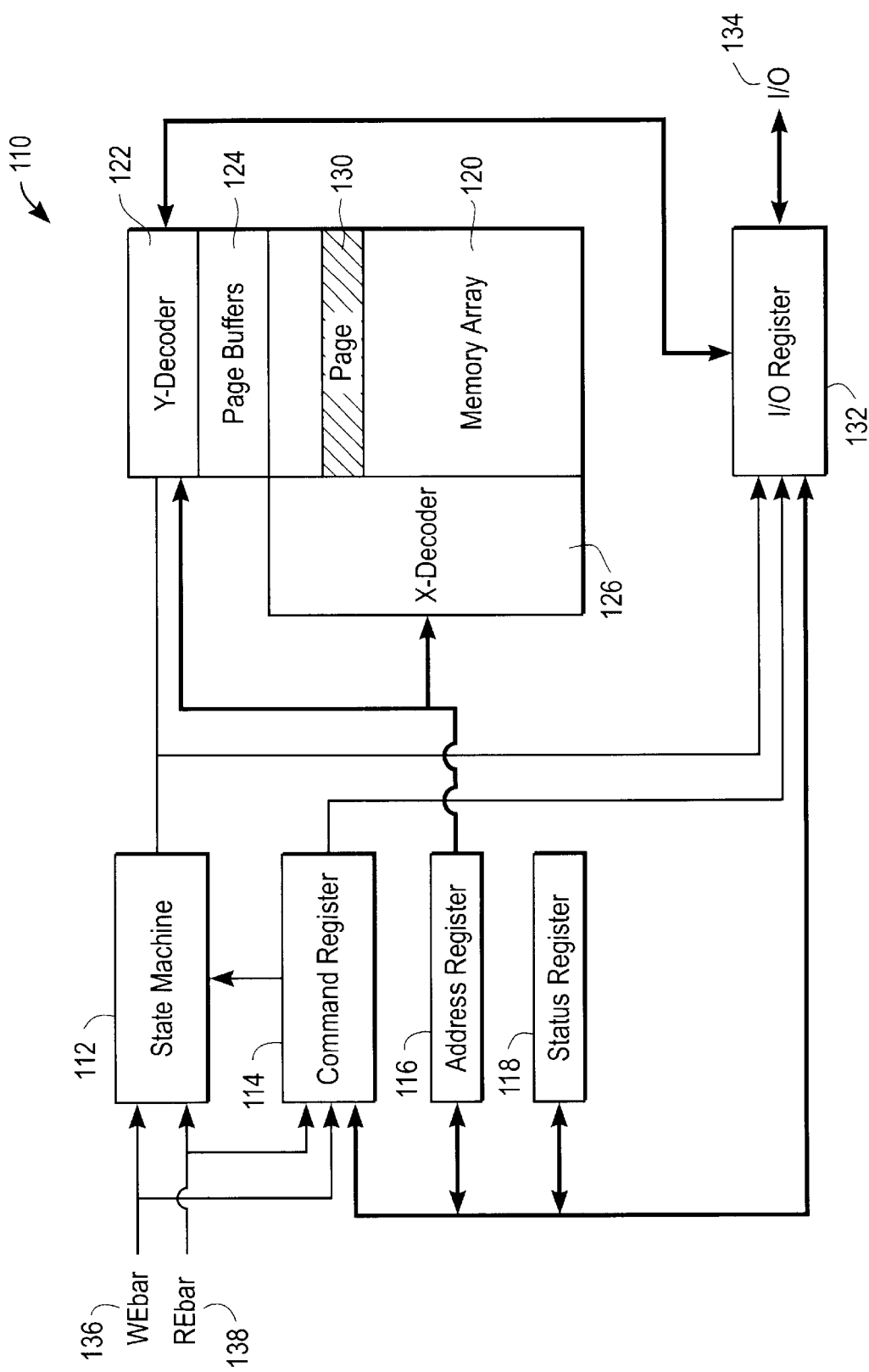
FIG. 1 is a simplified architecture of a typical prior art NAND type flash memory device.
Figure 10:
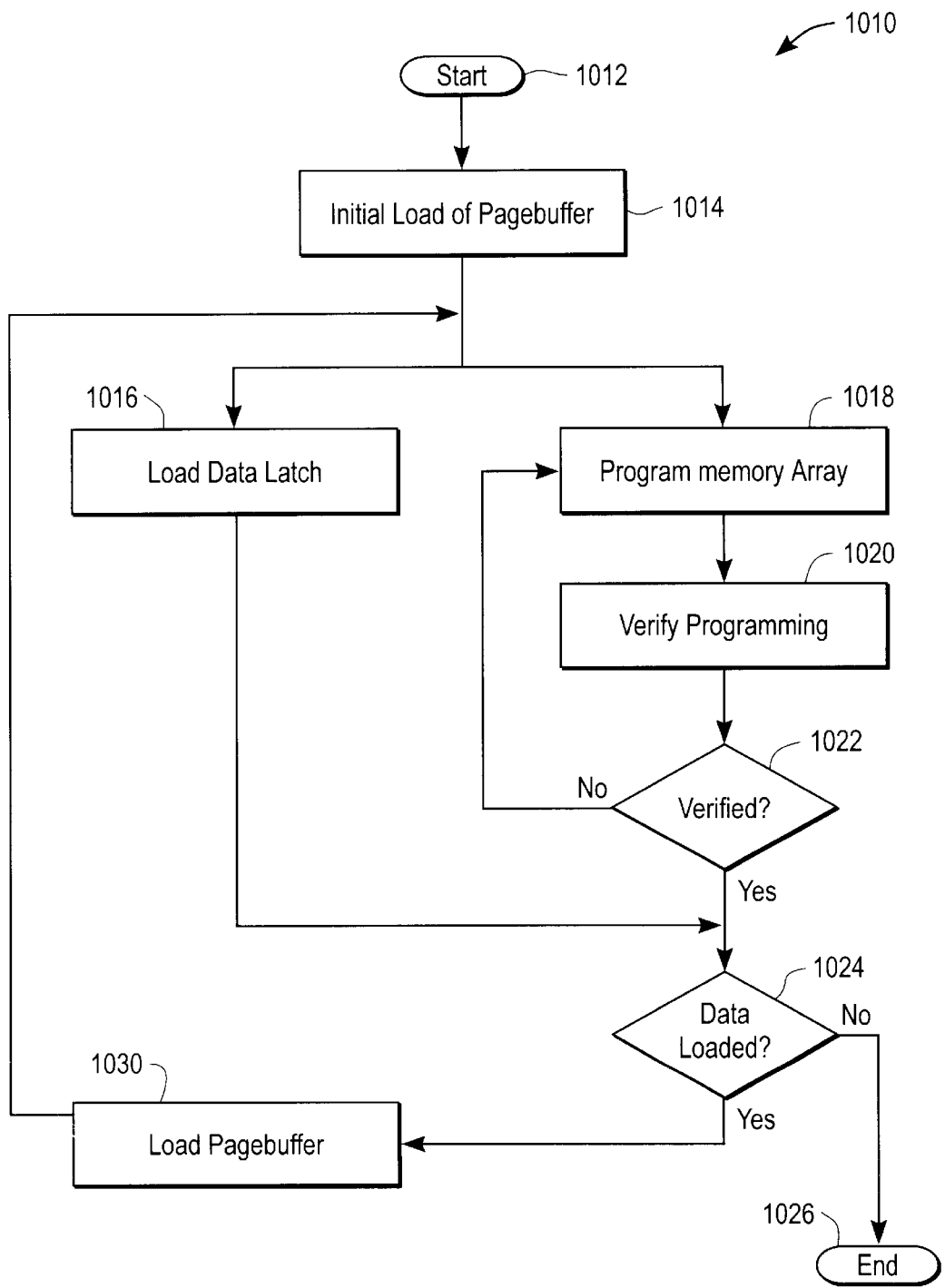
FIG. 10 is a simplified flowchart illustrating the substantially gapless programming of an embodiment of the present invention.

FIG. 10 is a simplified flowchart 1010 illustrating the substantially gapless programming of an embodiment of the present invention. At step 1014 the Page Buffer is initially loaded with data. For example, this includes a data bit coming from the Data Bus 812 through Y-Decoding 814 to Data Latch 816. In this initial case the DATAload Signal 842 is high and transistor 840 passes the data bit directly into Page Buffer 820 where it is stored in back-to-back inverters 334 and 336. Thus after initialization both the Data Latch 816 and the Pagebuffer 820 store the same data bit. After Pagebuffer 820 is initially loaded, the DATAload signal is set low, turning off the DATAload Switch 818; Then at step 1018, a memory cell in the Memory Array 120 (FIG. 1) is programmed with the data bit. While the above example illustrates the process for one bit, all bits in a page are processed the same way. Hence at step 1014 one page is loaded into the Pagebuffers 920 and at step 1018, the whole page is programmed into the memory array 922. In an alternative embodiment, a partial page programming may be done as in the case of the AMD/Fujitsu NAND Flash Memory Am3LVOI28D/MBM30LVOI28 In parallel with programming the page into the memory array, data from the next page is input into Intermediate Buffers 916 (step 1016). At step 1020 the programming of the page into the Memory Array 922 is verified by examining the Status Register 118 (FIG. 1). At step 1022, if the programming has not been verified, the page is again programmed into the array again at step 1018. If verified, then at step 1024, the data of the next page is checked to see if the data has been loaded properly into the Intermediate Buffers 916. If no, the process ends at 1026. This means either there is an error or there needs to be a wait until the data can finish loading or reloading into the Intermediate Buffers 916. If the data has been loaded successfully into Data Latch 816, then the Switch 918 is turned on, and the next page data is then transferred from the Intermediate Buffers 916 into the Pagebuffers 920 (step 1030). And after the transfer the Switch 918 is turned off. The next page in the Pagebuffers 920 is then programmed concurrently with another subsequent page (i.e., next—next page) being loaded into the Immediate Buffers 916. The above process is repeated until all the pages in the series of pages to be written are programmed into the Memory Array 922.

Figure 11:
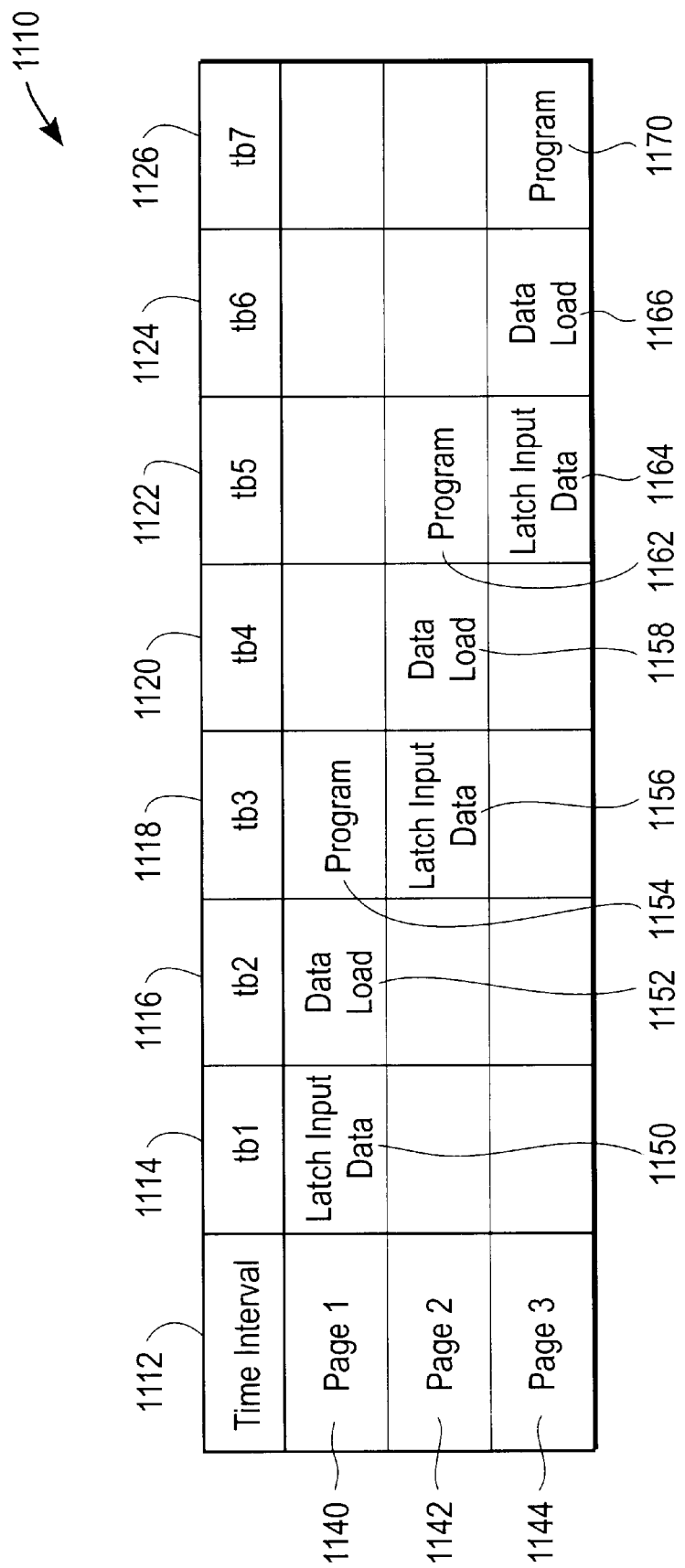
FIG. 11 illustrates an example of writing three pages of an embodiment of the present invention.

FIG. 11 illustrates an example of writing three pages of an embodiment of the present invention. FIG. 11 shows a table 1110, showing three consecutive pages, e.g., page 1 1140, page 2 1142, and page 3 1144, being written into the memory array. The time intervals 1112 include tb1 1114, tb2 1116, tb3 1118, tb4 1120, tb5 1122, tb6 1124, and tb7 1126. The time intervals representing the data load, e.g., tb2 1116, tb4 1120, and tb6 1166, are relatively short as the Data Load Switch, e.g., switch 818 in FIG. 8, only includes the turning on or off of a transistor, e.g., 840, and the loading of the bits into the Pagebuffers, are done in parallel. Page 1 1140 latches the input data 1150 into Data Latch 816 at time interval tb1 1114. Data Load Switch 818 is then turned on and the data is loaded 1152 into Pagebuffer 820 at time interval tb2 1116. The data stored in Pagebuffer 820 is then programmed into a memory cell via the associated bit line, at time interval tb3 1118. Next data from page 2 1142 is input 1156 into Data Latch 916 at time interval tb3 1118, which is during the same time interval that page 1 1140 is being programmed 1154. At time interval tb4 1120 the data for page 2 1142 is loaded 1158 from the Data Latch 816 into the Pagebuffer 820, and then programmed 1162 at time interval tb5 1122. Page 3 1144 starts at time interval tb5 1122 and proceeds similarly to page 2 1142 except shifted in time, i.e., latch input data 1164, data load 1166, and program 1170.

Thus one of the major advantages of pipelining is the reduction in total write time for a plurality of pages to be written to the memory array. This results occurs, after the pipeline is filled, because the next page data input to the intermediate storage, e.g., data latch, happens in parallel with the programming of the current page data stored in the page buffers.

Figure 12:
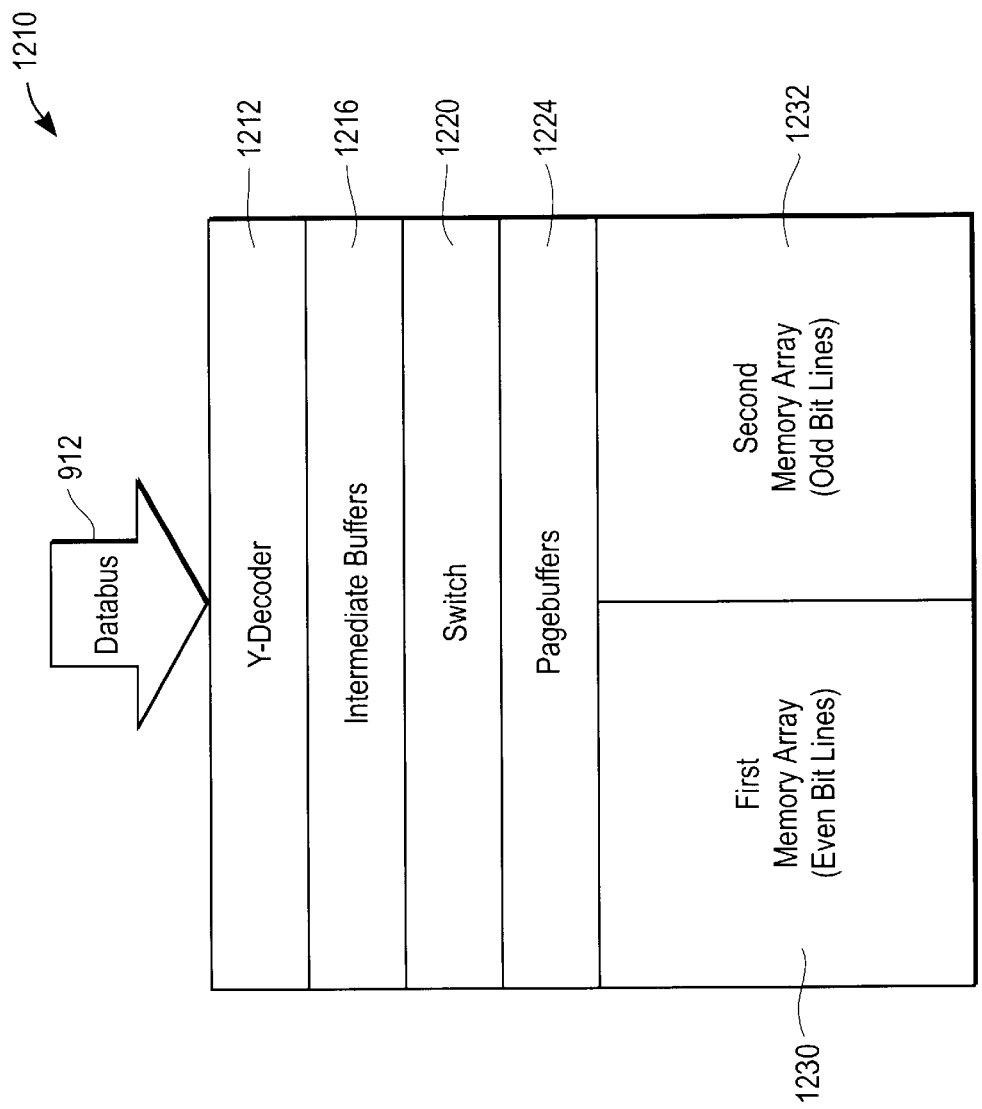
FIG. 12 is an alternative embodiment of the present invention that that splits the memory array into a plurality of parts.

FIG. 12 is an alternative embodiment of the present invention that that splits the memory array into a plurality of parts. The two memory arrays are shown for illustration purposes only as a first memory array 1230 and a second memory array 1232. In another embodiment both memory arrays 1230 and 1232 are part of the same memory array 120 (FIG. 1). FIG. 12 includes a Y-Decoder 1212, Intermediate Buffers 1216, a Switch (or switches) 1220, Pagebuffers 1224, first memory array 1230, that has the even number bit lines (BL), and second memory array 1232 that has the odd number bit lines (BL). The memory circuit 1210 functions similarly to that of the memory circuit 910 in FIG. 9, except on every other BL for each part of the memory array. Thus a page may be written to first memory array 1230 concurrently with another page being read from second memory array 1232. In other embodiments the plurality of parts of the memory array may have more than two parts and be divided into fixed or arbitrary sizes.

Figure 13:
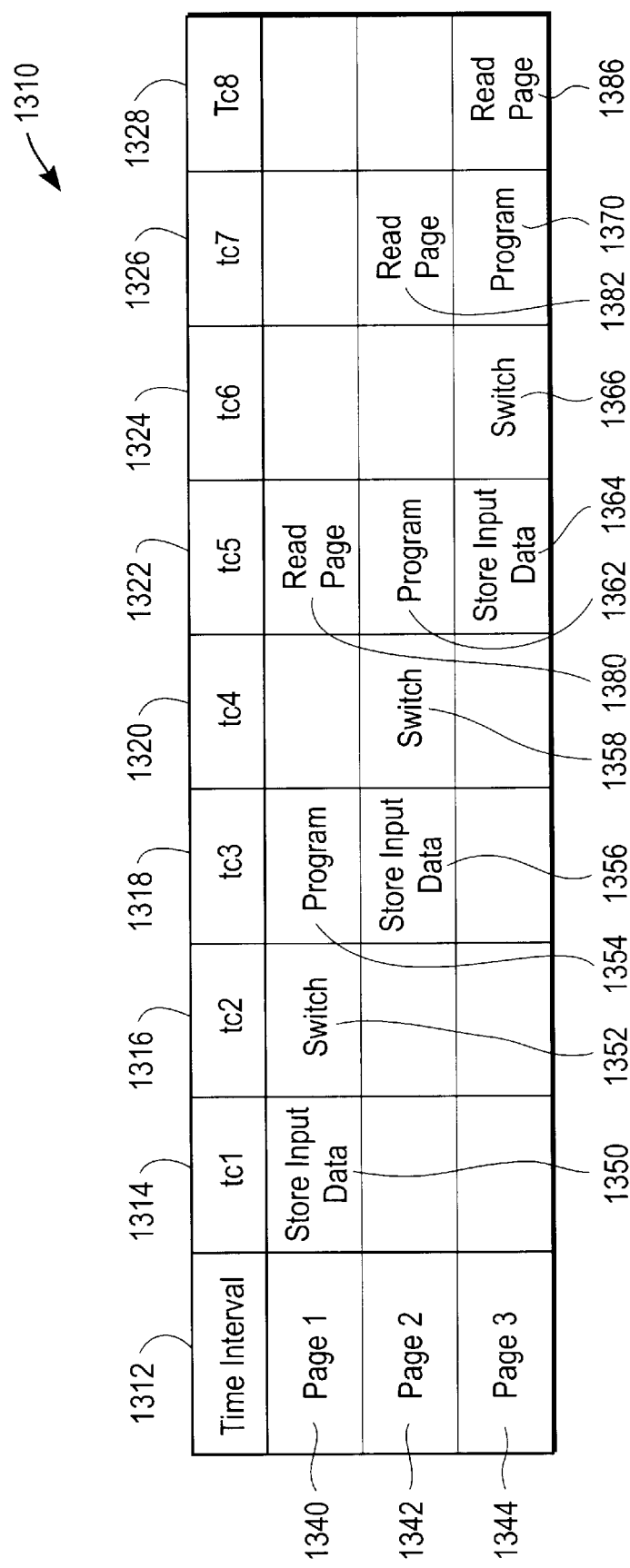
FIG. 13 illustrates an example of writing and reading three pages of an embodiment of the present invention.

FIG. 13 illustrates an example of writing and reading three pages of an embodiment of the present invention. FIG. 13 shows a table 1310, showing three consecutive pages, e.g., page 1 1340, page 2 1342, and page 3 1344, being written into and read from a memory array, e.g., the memory array 120 of FIG. 1 or the two memory arrays 1230 and 1232 in FIG. 12. The time intervals 1312 include tc1 1314, tc2 1316, tc3 1318, tc4 1320, tc5 1322, tc6 1324, tc7 1326, and tc8 1328. Page 1 1340 stores the input data 1350 into Intermediate Buffers 1216 at time interval tc1 1314. Switch 1220 is then turned on and the data is loaded at 1352 into Pagebuffers 1224 at time interval tc2 1316. The data stored in Pagebuffers 1224 is then programmed 1354 into the first Memory Array 1230 at time interval tc3 1318. Next, data from page 2 1342 is stored 1356 into Intermediate Buffers 1216 at time interval tc3 1318, which is during the same time interval that page 1 1340 is being programmed 1354. At time interval tc4 1320 the data for page 2 1342 is loaded 1358 from the Intermediate Buffers 1216 into the Pagebuffer 1224, and then programmed 1362 at time interval tc5 1322 into second Memory Array 1232. This is the same time interval tc5 that page 3 1344 stores input data 1364 into Immediate Buffers 1216 and that page 1 1340 reads a page 1380 from first Memory Array 1230 into Pagebuffers 1224. Thus time interval ta5 is an example when page us being read from the first Memory Array 1230, page 2 is being programmed into the second Memory Array 1232, and page 3 is being stored in the intermediate buffers 1216, where all three operations are done in parallel. At time interval tc6 1324 the data for page 3 1344 is loaded 1366 from the Intermediate Buffers 1216 into the Pagebuffer 1224, and then programmed 1370 at time interval tc7 1326 into first memory array 1230. This is the same time interval tc7 that page 2 1342 reads a page 1382 from second Memory Array 1232 into Pagebuffers 1224. Thus time interval tc7 is an example when page 2 is being read from the second memory array 1232, and page 3 is being programmed into the first memory array 1230. At time interval tc8, page 3 1344 reads a page 1386 from first Memory Array 1230 into Pagebuffers 1224. As writing and reading is done alternatively from memory arrays 1230 and 1232, where each memory array 1230 and 1232 represent different parts of memory array 120 in FIG. 1, reading and writing pages can occur in parallel. In other embodiments, the memory array 120 may have other combinations of bit lines, for example, 512 BL's for a first page followed by 512 BL's for a second page, or groups of BL's representing, part of one or more pages. There may be also a programmable switch between the Pagebuffers 1224 and the Memory Array 1230 and 1232 in order to route the bits to the appropriate bit lines.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set fourth in the claims.

What is claimed is:

1. A method for writing a plurality of pages to a flash memory using pipelining, said method comprising:
   receiving a first data input comprising a first page; and
   programming said first page in parallel with receiving a second data input, said second data input comprising a second page.

2. The method of claim 1 further comprising programming said second page in parallel with receiving a third data input, said third data input comprising a third page.

3. The method of claim 1 wherein said first page comprises a plurality of bytes.

4. The method of claim 1 wherein said flash memory includes a NAND type flash memory.

5. The method of claim 1 wherein said first page is received from I/O registers.

6. The method of claim 1 wherein said programming said first page uses a memory array.

7. The method of claim 1 wherein said programming said first page uses a ready/busy signal.

8. A method for substantially gapless programming of a NAND type flash memory, comprising:
   receiving a first data input, comprising a first page;
   programming said first page into a plurality of memory cells of said NAND type flash memory; and
   after said receiving said first data input, receiving a second data input in parallel with said programming said first page, wherein said second data input comprises a second page.

9. The method of claim 8 further comprising storing said first data input in a first memory location, and storing said second data input in a second memory location.

10. The method of claim 8 wherein said receiving said first data input further comprises a write enable transition for each byte of said first page.

11. The method of claim 8 wherein said receiving said second data input further comprises a write enable transition for each byte of said second page.

12. The method of claim 8 wherein said programming said first page comprises a ready/busy pulse of a predetermined duration.

13. A system for improving performance in a NAND type flash memory array, comprising:
   a first buffer circuit for receiving a first data item;
   a memory cell in said NAND type flash memory array that is programmed using said first data item;
   a second buffer circuit for receiving a second data item while said memory cell is programmed using said first data item; and
   a switch for transferring said second data item to said first buffer circuit.

14. The system of claim 13 wherein said first buffer circuit is a pagebuffer.

15. The system of claim 14 wherein said pagebuffer includes a keeper.

16. The system of claim 13 wherein said second buffer circuit is a data latch.

17. The system of claim 16 wherein said data latch includes a keeper.

18. The system of claim 13 wherein said second buffer circuit is a register.

19. The system of claim 13 wherein said switch is a data load switch.

20. The system of claim 19 wherein said data load switch comprises a CMOS transistor with a dataload control signal.

21. The system of claim 13 wherein said switch consists of a circuit selected from a group consisting of a pMOS transistor, a combination of one or more CMOS transistors, at least one bipolar transistor, at least one logic gate, a tri-state circuit, a programmable switch, a mechanical switch, or a fluidic switch.

22. A system for improving performance in a NAND type flash memory array, comprising:
   a data latch for receiving a first page data item from a I/O register;
   a dataload switch for transferring said first page data item to a pagebuffer; and
   a memory array cell for non-volatile storing of said first page data item, wherein said data latch receives a second page data item in parallel with said storing of said first page data item.

23. The system of claim 22 wherein said dataload switch is a circuit with connect and disconnect functions.

24. The system of claim 22 wherein said data latch is either a latch or a flip-flop.

25. The system of claim 22 wherein said pagebuffer is a register circuit.

26. The system of claim 22 wherein said pagebuffer includes a back-to-back inverter circuit.

27. A method for reducing a total time for writing a plurality of sequential pages of data, comprising:
   loading a data latch with a next page of said plurality of sequential pages of data; and
   concurrently with said loading, performing operations on a memory array comprising:
      programming said memory array with a page of said plurality of sequential pages of data, said page stored in a pagebuffer;
      verifying said programming by examining a status register; and
      when said next page is loaded properly, loading said pagebuffer with said next page.

28. The method of claim 27 herein said loading said data latch comprises a plurality of write enable bar (WEbar) pulses.

29. A method for transferring a plurality of pages to and from a flash memory comprising:
   receiving a first data input comprising a first page;
   programming said first page into said flash memory in parallel with receiving a second data input, said second data input comprising a second page; and
   reading a third page from said flash memory in parallel with said programming said first page.

30. A system for improving performance in a NAND type flash memory array, comprising:
   a first buffer circuit for receiving a first data item;
   a first memory cell in said NAND type flash memory array that is programmed using said first data item;
   a second buffer circuit for receiving a second data item while said first memory cell is programmed using said first data item;
   a switch for transferring said second data item to said first buffer circuit; and
   a third buffer circuit for receiving the reading of a second memory cell in said NAND type flash memory array, while said first memory cell is programmed using said first data item.

* * * * *